United States Patent [19]

Goser et al.

[11] B 4,002,928

[45] Jan. 11, 1977

[54] PROCESS FOR TRANSMITTING SIGNALS BETWEEN TWO CHIPS WITH HIGH-SPEED COMPLEMENTARY MOS CIRCUITS

[75] Inventors: Karl Goser, Munich; Michael Pomper, Schliersee, both of Germany

[73] Assignee: Siemens Aktiengesellschaft, Berlin and Munich, Germany

[22] Filed: Sept. 17, 1974

[21] Appl. No.: 506,840

[44] Published under the second Trial Voluntary Protest Program on March 23, 1976 as document No. B 506,840.

[30] Foreign Application Priority Data

Sept. 18, 1973 Germany .......................... 2346966

[52] U.S. Cl. ................ 307/251; 307/205; 307/303; 307/304; 307/DIG. 1
[51] Int. Cl.² .................. H03K 17/60; H03K 19/08
[58] Field of Search .......... 307/205, 221 C, DIG. 1, 307/303, 304, 251

[56] References Cited

UNITED STATES PATENTS

| | | | |
|---|---|---|---|
| 3,588,527 | 6/1971 | Cricchi | 307/221 C |
| 3,590,273 | 6/1971 | Jarvis | 307/DIG. 1 |
| 3,673,438 | 6/1972 | Lund | 307/304 X |
| 3,675,043 | 7/1972 | Bell | 307/DIG. 1 |
| 3,676,700 | 7/1972 | Buchanan | 307/DIG. 1 |
| 3,731,114 | 5/1973 | Gehweiler | 307/205 |
| 3,739,200 | 6/1973 | D'Agostino | 307/DIG. 1 |
| 3,801,831 | 4/1974 | Dame | 307/205 |
| 3,835,457 | 9/1974 | Yu | 307/DIG. 1 |

OTHER PUBLICATIONS

IBM Tech. Disc. Bulletin, vol. 16, No. 5, 10/1973, "Low-Power Gated Receiver", by Chin et al.

Primary Examiner—John S. Heyman
Attorney, Agent, or Firm—Hill, Gross, Simpson, Van Santen, Steadman, Chiara, & Simpson

[57] ABSTRACT

Two semiconductor chips having complementary MOS circuits are interconnected by means of an output stage provided on the first chip and an input stage provided on the second chip. The connection is a high-speed connection despite the relatively high internal impedance of the MOS transistors. The output stage incorporates MOS transistors for transforming the signal level to a relatively low level, and the input stage incorporates MOS transistors interconnected as a pulsed trigger or amplifier for restoring the low signal to a relatively high level for connection to other MOS circuits.

10 Claims, 2 Drawing Figures

PROCESS FOR TRANSMITTING SIGNALS BETWEEN TWO CHIPS WITH HIGH-SPEED COMPLEMENTARY MOS CIRCUITS

BACKGROUND

1. Field of the Invention

The present invention relates to complementary MOS circuits and specifically to a method for providing a high-speed interconnection between semiconductor chips incorporating complementary MOS circuits, despite the high internal impedance of the MOS transistors.

2. The Prior Art

Semiconductor circuits incorporating complementary MOS transistors are recognized as having desirable characteristics, among which is their relatively low power consumption. A disadvantage of such circuits, however, derives from their relatively slow speed of operation in many cases, due to the relatively high internal impedance of the MOS transistors. The high internal impedances do not permit a rapid charging of the capacitance associated with a connecting line interconnecting an output of one complementary MOS circuit with the input of another complementary MOS circuit, and connecting lines having low characteristic impedances cannot be used effectively because of the relatively high voltage levels characteristic of the complementary MOS circuits. Although it is known in the art to use relatively low impedance transistors as output stages, such transistors occupy a very large space and therefore interfere with the achievement of maximum density of components on the semiconductor chips.

SUMMARY OF THE PRESENT INVENTION

It is a principal object of the present invention to provide a method for interconnecting semiconductor chips having complementary MOS circuits in a way which furnishes a high speed connection, despite the relatively high internal impedances of the MOS transistors.

Another object of the present invention is to provide such a method which does not require the use of low impedance output transistors which occupy a relatively large space.

A further object of the present invention is to provide such a method employing exclusively MOS transistors.

Another object of the present invention is to provide such a method in which low impedance transmission lines can be used effectively.

In one embodiment of the present invention, a method of connecting first and second semiconductor chips, each having complementary MOS circuits, is provided, including the steps of providing on the first chip an output circuit formed of MOS transistors for reducing the signal level from an input level furnished by a connected complementary MOS circuit to a lower level, providing an input circuit on the second semiconductor chip for receiving the low level signal and restoring it to a relatively high level for connection to an associated complementary MOS circuit.

These and other objects of the present invention will become manifest by examination of the following description and the accompanying drawings.

BRIEF DESCRIPTION OF THE DRAWINGS

Reference will now be made to the accompanying drawings, in which.

DESCRIPTION OF THE PREFERRED EMBODIMENT

Figure 1:
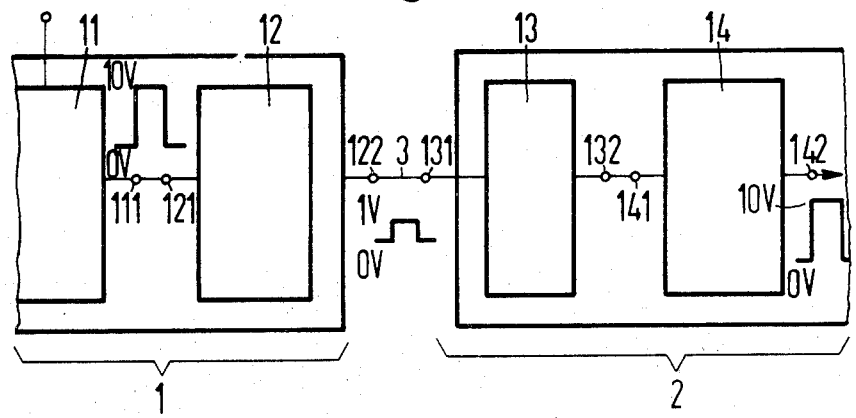
FIG. 1 is a functional block diagram of two semiconductor chips interconnected in accordance with the preferred embodiment of the present invention.

The process of the invention will now be explained in association with FIG. 1. On a first chip 1 are arranged an internal circuit 11 which consists, for example, of an ESFI-MOS circuit, and an output stage 12. An ESFI-MOS circuit is to be understood as a circuit in which insular semiconductor layers of silicon are arranged on an electrically insulating substrate, such as sapphire, spinel, etc., wherein said semiconductor layers contain the individual components. The output 111 of the internal circuit 11 is connected to the input 121 of the output stage 12. In the output stage 12 the high signal level of the internal complementary MOS circuit 11 is transformed to a relatively low level and fed to an output terminal 122. This advantageously causes a saving of power in the output stage. The output terminal 122 is connected via a connection line 3 to the input terminal 131 of the input stage 13 arranged on the second chip 2. In this input stage, the low level signal which is transmitted from the first chip 1 controls a switch formed, for example, of MOS transistors, the output of which leads to an amplifier which amplifies the low signal to the high signal required for the internal complementary MOS circuit 14. The high signal is applied to the output 132 of the input stage 13. The output 132 is connected to the input 141 of the internal circuit 14.

Pulsed flip-flops, mono- or astable flip-flops or a plurality of inverter stages are employed, e.g. as the amplifier 13. Amplifiers of this type can be triggered from the exterior by a pulse train, such as a train of clock pulses, which partially supplies the power required for the amplification.

Figure 2:
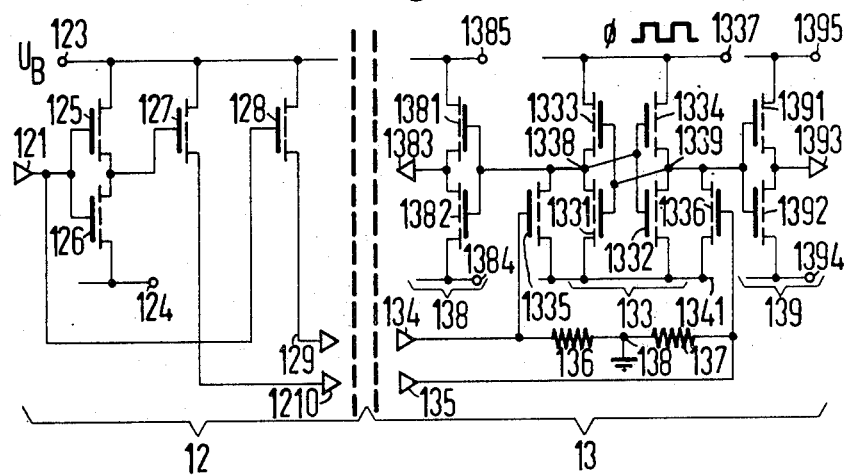
FIG. 2 is a schematic circuit diagram illustrating, in greater detail, the structure of portions of the apparatus of FIG. 1.

FIG. 2 illustrates special circuits, in accordance with the invention, of an output stage 12 and an input stage 13. Such circuits are used for high-speed complementary MOS circuits which are constructed both in solid silicon techniques and also in the ESFI-MOS technique. Details of FIG. 2 which have already been explained in FIG. 1 bear corresponding references.

The signal from the internal circuit of the first chip 1 is fed to the input 121 of the output stage 12 arranged on the chip 1. The operating voltage is connected between the terminals 123 and 124. Preferably the terminal 124 is connected to 0 V. and the terminal 123 to approximately 10 V. The connection line to the other chip 2 is operated via a source follower. To reduce the liability to faults, however, it is expedient to preferably employ two output terminals 129 and 1210 on which complementary output signals are transmitted. For this purpose the high-level signal which is present at the input 121 is directly fed to the gate of the transistor 128, which is switched conductive when a signal is present, and thus a voltage preferably approximately in the order of 1 V. (ECL level) is switched to the output terminal 129. For the production of the complementary output signal, the signal which is present at the input 121 and which is in the order of approximately 5 to 10 V. is fed to the inverter which consists of the transistors 125 and 126 and which inverts this signal and passes it to the gate of the transistor 127. This ensures that the transistor 127 is opened when no signal is present at the input 121. This means that the signal which is complementary to the signal at the output terminal 129 is present at the output terminal 1210. Preferably the transistors 126, 127, and 128 are designed in the N-channel MOS technique and the transistors 125 in the P-channel MOS technique.

As the transistors of the source follower preferably possess the smallest possible dimensions with a small inner impedance, these transistors can be produced by the so-called double diffusion technique. At 10 V. an inner impedance of approximately 900Ω is sufficient to produce a signal of 1 V. at 100Ω. In this diffusion technique transistors having channel lengths of approximately $10^{-6}$ m can be produced. The earlier patent applications, Ser. No. 430,097, filed Dec. 28, 1973 and Ser. No. 487,153, filed July 10, 1974, describe in detail such transistors which are produced by the so-called double diffusion technique. These transistors have the further advantage that the capacitance between gate and drain is very small and thus the capacitive coupling which acts as an interference in the recharging is kept low.

An essential component of the input stage 13 arranged on the second chip is an amplifier stage, preferably a pulsed bistable trigger stage 133. The publication "Storage Array and Sense/Refresh Circuit For Single Transistors Memory Cells" JEEE SC-7 (1972), p. 217, describes bistable trigger stages of this type. The trigger stage shown in FIG. 2 consists of the transistors 1331 to 1334. The transistor 1335 is connected in parallel to the transistor 1331 in the manner shown in FIG. 2. The transistor 1336 is connected in parallel to the transistor 1332. The gate electrode of the transistor 1335 is connected to the inputeterminal 134 of the input stage 13. This input terminal 134 is in turn connected via a connection line (not shown) to the output terminal 129 of the output stage 12 of the first chip. The gate electrode of the transistor 1336 is connected to the input terminal 135 of the stage 13. Suitable quiescent operating potentials are applied to the trigger circuit via terminal 1337 and a line 1341, so that bistable operation of the trigger circuit is achieved.

The input terminal 135 is connected via a connection line, again now shown in the figure, to the output terminal 1210 of the output stage 12 of the first chip. On the second chip the connection lines are preferably terminated with their surge impedance. For this purpose the impedances 136 (100Ω) and 137 (100Ω) are provided. The point 138 lying between these impedances preferably carries 0 V. Preferably the transistors 1331, 1332, 1335, and 1336 are constructed in the N-channel MOS technique, and the transistors 1333 and 1334 in the P-channel MOS technique.

During operation the bistable trigger stage 133 is pulsed. For this purpose the pulse train $\phi$ is connected to the line 1337. Initially the pulse train will be assumed to be disconnected. In accordance with the input signals which are applied to the inputs 134 and 135, the impedances of the two input MOS transistors 1335 and 1336 are set. When the pulse train voltage is connected, the bistable trigger stage 133 is set in accordance with the states of the two input MOS transistors. The voltages occurring at the nodal points 1338 and 1339 of the trigger circuit are amplified via two inverter stages 138 and 139 and conducted to a further circuit 14 on the chip. The inverter 138 which consists of the transistors 1381 and 1382 is connected to the node 1338 of the trigger circuit. Preferably the terminal 1384 of the inverter 138 is connected to earth and the terminal 1385 to 10 V. The transistor 1381 is preferably constructed in the P-channel MOS technique and the transistor 1382 in the N-channel MOS technique. The inverter 139, which consists of the transistors 1391 and 1392, is connected to the node 1339 of the trigger circuit. Preferably the point 1394 of the inverter 139 is connected to earth and the point 1395 to approximately 10 V. The transistor 1391 is preferably constructed in the P-channel MOS technique and the transistor 1392 in the N-channel MOS technique.

The input signals, applied to the input terminals 134 and 135, are amplified, timed with the pulse train frequency, and conducted to the logic circuit 14 on the second chip. Instead of the input-MOS transistors 1335 and 1336, so-called MES field effect transistors can alternatively be employed. These can be produced compatibly with the ESFI-MOS technique and may exhibit a steeper gradient than the MOS transistors.

A further improvement in the circuit of the input stage 13, which can be used to achieve the required amplification, is the so-called bootstrap effect. The publication, "Eliminating Threshold Losses in MOS Circuits by Bootstrapping Using Varactor Coupling," in IEEE SC-7 (1972), p. 217, describes this effect.

It will be understood to those skilled in the art that various modifications may be made in the construction of the invention without departing from the essential features of novelty thereof, which are intended to be defined and secured by the appended claims.

What is claimed is:

1. A process for transmitting signals between first and second semiconductor chips each having high-speed complementary MOS circuits, comprising the steps of providing an output stage on the first chip for transforming the voltage level of a signal from a connected MOS circuit to a relatively low level voltage, providing a connection line for transmitting the relatively low level voltage to the second chip, whereby the connection line is connected with the output stage on the first chip, and providing an input stage on a second chip for amplifying the low level voltage to the original voltage level, whereby said input stage is connected with the connection line and the signal is restored to its original level for connection to a subsequent MOS circuit on the second chip.

2. The method according to claim 1, including the step of providing a pair of connecting lines for interconnecting the output stage of the first chip and the input stage of the second chip, whereby complementary signals may be transmitted over the connection lines between the two chips.

3. The method according to claim 2, including the step of providing a pair of impedances on said second chip connecting with said transmission lines, said impedances having values of impedance which match the characteristic impedance of both of said connecting lines.

4. The process according to claim 1, including the step of using a source follower to transform the voltage level from the MOS circuit on the first chip to a relatively low level.

5. Apparatus for transmitting signals between first and second semiconductor chips with high-speed complementary MOS circuits, comprising an output stage associated with the first chip, said output stage including an inverter, the input of said inverter being connected to receive a signal from a MOS circuit of the first chip, an output transistor having its input connected to the output of said inverter and its output connected to a first transmission line interconnecting the first and second chips, and a further output transistor having its input connected to receive said signal from said MOS circuit of the first chip and having its output connected to a second transmission line interconnecting the first and second chips, whereby complementary signals are provided on the two connecting lines, an input stage on the second chip, said input stage including an amplifier adapted to receive a signal connected from the first chip, and an inverter interconnected between said amplifier and a complementary MOS circuit located on the second chip.

6. Apparatus according to claim 5, wherein said output transistors are each connected as a source follower with its source terminal connected to one of said transmission lines.

7. Apparatus according to claim 5, wherein said amplifier comprises a pulsed, bistable trigger.

8. Apparatus according to claim 5, wherein said amplifier comprises a monostable trigger.

9. Apparatus according to claim 5, wherein said connection between said first and second semiconductor chips comprises a pair of connecting lines for transmitting complementary signals between said chips, said input stage being connected to said connecting lines, and a pair of impedances connected to said connecting lines having values of impedance which match the characteristic impedance of both of the connecting lines.

10. For use in connection with a process for transmitting signals between two semiconductor chips with high-speed complementary MOS circuits, a combination comprising an input stage associated with one of said semiconductor chips, said input stage including an amplifier adapted to receive a signal connected from the other semiconductor chip, an inverter interconnected between said amplifier and a complementary MOS circuit located on said one chip, and a connection between said one chip and said other chip comprising a pair of connecting lines for transmitting complementary signals between said chips, said input stage being connected to said connecting lines, and a pair of impedances connected to said connecting lines having values of impedance which match the characteristic impedance of both of the connecting lines.

* * * * *